United States Patent
Foster et al.

[11] Patent Number: 6,111,400
[45] Date of Patent: Aug. 29, 2000

[54] DIGITAL OSCILLOSCOPE'S AUTOMATED PARAMETER MEASUREMENT COOPERATES WITH TRIGGER REFERENCE

[75] Inventors: John Angus Foster; Michael L. Beyers, both of Colorado Springs, Colo.

[73] Assignee: Agilent Technologies, Palo Alto, Calif.

[21] Appl. No.: 09/182,684

[22] Filed: Oct. 30, 1998

[51] Int. Cl.[7] .......................... G01R 13/20; G01R 13/00; G01R 13/02
[52] U.S. Cl. .......................... 324/121 R; 702/66; 702/67
[58] Field of Search .................. 324/121 R, 990, 324/115, 76.24; 702/66, 67

[56] References Cited

U.S. PATENT DOCUMENTS

| | | | |
|---|---|---|---|
| 5,877,621 | 2/1999 | Beyers | 324/121 R |
| 5,978,742 | 2/1999 | Pickerd | 702/66 |

Primary Examiner—Safet Metjahic
Assistant Examiner—James C Kerveros
Attorney, Agent, or Firm—Edward L. Miller

[57] ABSTRACT

A digital oscilloscope automatically selects as the initial instance of a waveform parameter to be measured the instance that is both visible in the displayed trace and closest to the trigger reference point. Such a manner of automatic selection allows a greater amount of panning and zooming while the 'scope is subsequently stopped, without causing a different instance to become the measured instance, and also reduces confusion about continuity of measurement while the display is altered with the 'scope is still running. This automatically selected choice can still be overridden, if desired, by a manual selection. A further refinement is to, once an instance is automatically selected, retain it as the selected instance as long as it remains visible as part of a modified displayed trace, even if it would not otherwise become the selected initial instance if the measurement activity were first initiated with that modified trace. Still another refinement is to alert the operator that, owing to the previously automatically selected instance having been panned or zoomed off screen, a new and different automatically selected instance is now being measured.

3 Claims, 4 Drawing Sheets

(THERE IS DATA IN THE ACQUISITION
MEMORY AND AN AUTOMATICALLY
SELECTED MEASUREMENT IS
TO BE PERFORMED)

46

↓ 47

BEGINNING WITH THE
TRP, SEARCH ON EACH SIDE
TO FIND EDGES RELEVANT
TO THE WAVE FORM
FEATURES OF INTEREST — 48

↓

SELECT THE EDGE
CLOSEST TO THE TRP — 49

↓

NOTE THE DISPLACEMENT
"Δ" OF THE SELECTED
EDGE FROM THE TRP — 50

↓ 51

(MAKE AND DISPLAY
THE MEASUREMENT)

*FIG. 3*

DIGITAL OSCILLOSCOPE'S AUTOMATED PARAMETER MEASUREMENT COOPERATES WITH TRIGGER REFERENCE

BACKGROUND OF THE INVENTION

Because they store a stream of digitized data into a memory, digital oscilloscopes have powerful features concerning how they may be triggered. For example, unlike an analog 'scope that must be triggered before it commences a trace, the digital 'scope can be instructed to display the waveform(s) preceding a trigger event (so called "negative time"). Indeed, the memory of a digital oscilloscope is often large enough that regardless of the selected time scale (unit of time per horizontal division, and corresponding to the "sweep speed" of an analog 'scope) there is more stored waveform data than can be displayed on the screen, and the user has been given the ability to specify (within limits determined in part by the size of the memory) how the display is to be oriented relative to the trigger event. In one manufacturer's series of digital 'scopes this process involves: (1) Specifying an arbitrary separation in time (delay) between the trigger event and a location that may be called the "trigger reference point", or TRP; and, (2) Specifying a location in the display (left end, middle or right end) where the TRP is to appear within the visible trace. For example, when the 'scope first turns on it may default to: (1) A separation (delay) of zero; and, (2) Placement of the TRP in the middle of the display. This means that the left half of the trace occurred before the trigger event, the trigger event corresponds to the middle of the trace, and that the right half of the trace occurred subsequent to the trigger. This is a flexible architecture that allows many desirable operations. For example, data acquisition can be halted (the 'scope "stopped") and the display panned and zoomed (within limits imposed by memory) by changing the time scale and the delay between the trigger event and the TRP, all after the fact.

Another feature often present in such digital 'scopes is the ability to examine the digitized data stored in memory and automatically measure selected parameters of interest, such as frequency, voltage excursions, and rise times. Very often the parameter to be measured is not something that pertains to the entire waveform stored in the memory (as does, say, RMS voltage) but instead pertains to an individual cycle of a signal, of which there may be several cycles in the digitized data in memory. An example is the measurement of rise time. Some rule must exist to select which particular cycle it is whose rise time will be automatically measured. (Non-automatic measurement is also possible, and involves a manually performed indication of where the measurement is to occur.) A conventional practice in a digital oscilloscope that is "running" (i.e., is adding digitized data to acquisition records in memory, which allows the displayed trace to change and reflect the most recent waveform shape) is to measure the earliest one that is visible in the display. It is also conventional to somehow indicate where on the trace the parameter was measured, say, either by intensification or by bracketing that region with cursors. That is all well and good, but suppose that the 'scope is then "stopped" (i.e., data acquisition halted and the content of memory frozen), and some adjustment made about what portion of the captured waveform is to be displayed as the trace. Unexpected or aggravating circumstances may ensue.

For example, suppose that rise times were being measured automatically, that more than one rising edge is present in the displayed trace, that the left-most visible thereof is measured, and that the TRP is in the center. Let there be an unmeasured rising edge that is fairly close to the TRP. Now the operator stops the 'scope and alters the delay and/or time scale (think: zooms in or out) to view the measured rising edge in a context that places it in the middle of preceding and subsequent rising edges, so that he may better appreciate the circumstances. Since the rising edge of interest is no longer the first within the visible display, the measurement is now performed on a different rising edge (because it is now the first visible rising edge). This change in instance of the parameter measured is made without warning, and might easily be overlooked by an unwary operator. To be sure, he can use conventional means to force the measurement to be on the rising edge of interest by overriding the automatic selection process with manually positioned cursors. But this is both an aggravation and a potential source of error, since he might not position the cursors on the selected feature in the same way as the automatic algorithm does. For instance, he might not position the cursors on the same start and stop percentages of excursion for rise time that the 'scope would select.

It would be desirable if a stopped digital 'scope allowed the operator to zoom and pan to alter the display of a captured waveform while minimizing incidental changes that alter which instance of an automatically measured parameter is the measured instance.

It would be especially desirable if the minimization of incidental alterations of the automatically selected measured instance were also operative even when the digital 'scope were running, as this would allow the operator to alter the display settings and still see the same automatically selected measurement as before, and it would reduce the chance that the operator would become confused about which instance is which during extensive manipulation of the display controls.

It would also be desirable if the operator were informed by the digital 'scope if there were a change in automatically selected instance.

SUMMARY OF THE INVENTION

A digital oscilloscope automatically selects as the initial instance of a waveform parameter to be measured the instance that is both visible in the displayed trace and closest to the trigger reference point. This new manner of automatic selection allows a greater amount of panning and zooming while the 'scope is subsequently stopped, without causing a different instance to become the measured instance. This automatically selected choice can still be overridden, if desired, by a manual selection. A further refinement is to, once an instance is automatically selected, retain it as the selected instance as long as it remains visible as part of a modified displayed trace, even if it would not otherwise become the selected initial instance if the measurement activity were first initiated with that modified trace. Still another refinement is to alert the operator that, owing to the previously automatically selected instance having been panned or zoomed off screen, a new and different automatically selected instance is now being measured.

BRIEF DESCRIPTION OF THE DRAWINGS

FIG. 3 is a simplified flow chart illustrating a first aspect of the process of automatically selecting a waveform feature to be measured by a digital oscilloscope constructed in accordance with the invention.

DESCRIPTION OF A PREFERRED EMBODIMENT

Figure 1:
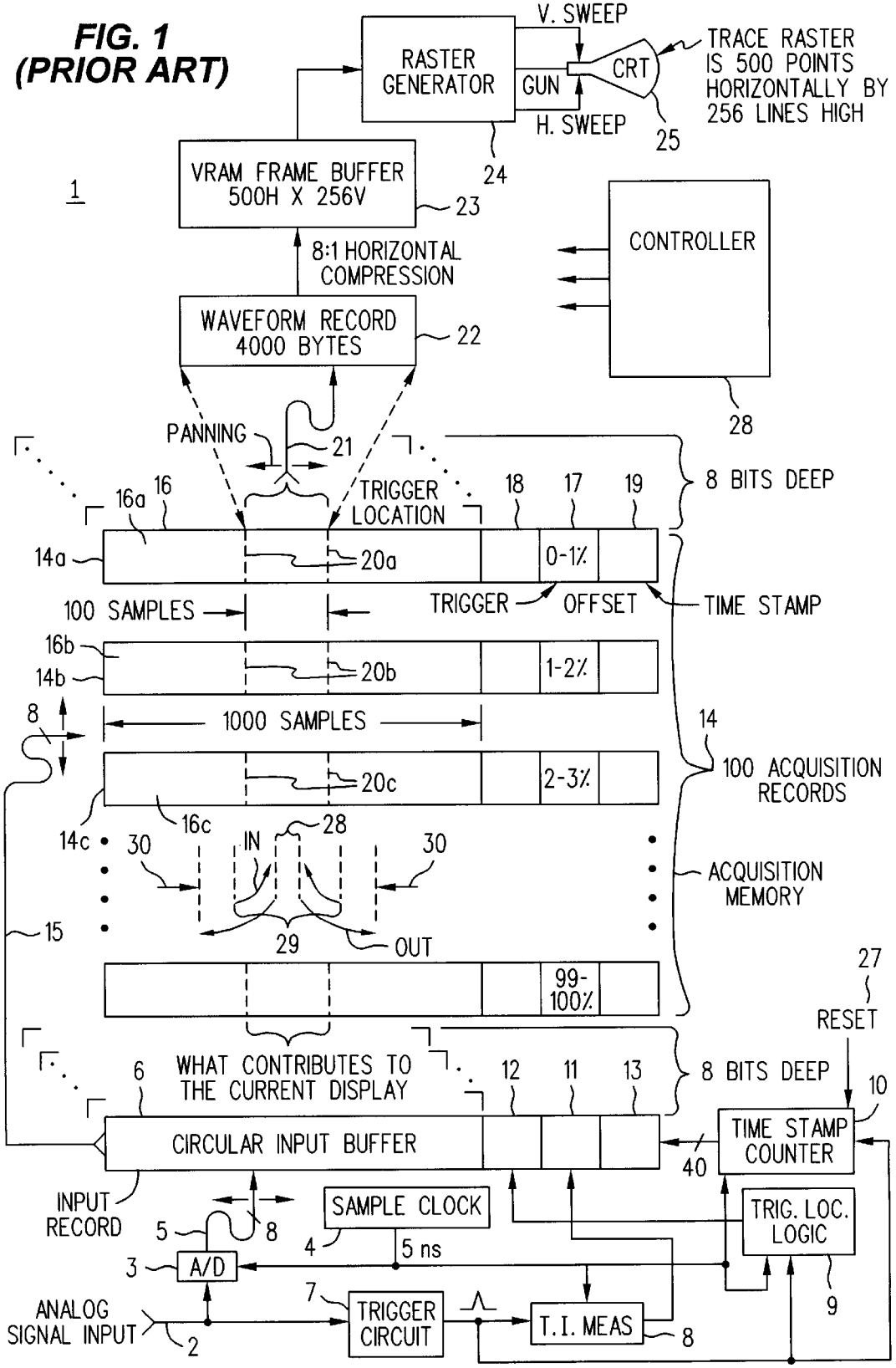
FIG. 1 is a simplified block diagram of a prior art digital oscilloscope of a type to which the invention is applicable.

Refer now to FIG. 1, wherein is shown a simplified and conventional block diagram 1 of the data acquisition and display preparation portions of a random repetitive digital oscilloscope. That block diagram and the following condensed description thereof have been borrowed from an earlier application for the purpose of providing an exemplary environment in which the invention may be practiced. It will be understood that it is by no means necessary that the digital oscilloscope be of the random repetitive variety, and the time stamp feature shown is there only because it was more trouble to remove it than to leave it in. It does not cooperate with the invention. It will, for example, be understood that in principle the oscilloscope could be of the direct sampled sequence variety, that the A/D 3 could be a "doomsday" sampling mechanism running at the highest possible rate and whose output 5 is applied directly to a multi-megabyte waveform record 22, with the intermediate acquisition records 14 being absent. That said, we now turn to a brief description of the oscilloscope of FIG. 1.

The block diagram 1 illustrates the flow of data from an analog signal input 2 to its display upon a CRT 25. The block diagram does not address multiple channel inputs, various rules for allocating memory into different amounts of record length versus number of records (based on control settings, such as time scale), nor does it concern itself with the various annotations and measured values that can be written in letters next to the trace. Instead, it addresses an architecture for acquisition memory utilization that allows captured data displayed at a near maximally fast time scale to have its trace reformulated for panning left and right and for zooming in and out, all based on data previously captured and presently in the acquisition memory. It will be perfectly clear to those skilled in the art how to apply these techniques shown here in a simplified single trace environment to the usual more complicated environments having multiple traces with measurement annotations included in the display.

Note that an analog signal input 2 is applied to an A/D (Analog to Digital) converter 3 and to a trigger circuit 7. The signal applied to the analog signal input is any time variant voltage to be measured by the oscilloscope, and could be either "analog" or "digital" as far as its function in its native environment is concerned. As far as the oscilloscope is concerned, it is just a (presumably repetitive) time variant voltage whose waveform is to be measured and displayed.

The A/D converter 3 is responsive to a sample clock signal produced by a sample clock circuit 4. We will assume that, for our purposes, the sample clock is fixed at 5 ns per period. Each time a particular edge occurs in the sample clock signal the A/D converter 3 converts the instantaneous value of the applied analog signal input to an 8-bit value (which may be Gray coded or be straight binary). This value is then stored in the next location in a circular input buffer 6 that is large enough to store one thousand eight bit samples. This forms the basis for what will eventually become an input record. The applied analog signal input 2 is also coupled to a trigger circuit 7, whose function it is to "synchronize" the displayed trace with some selected event, such as the input value crossing a threshold in a given manner. The output of the trigger circuit 7 is applied to a time interval measurement circuit 8 and to a trigger location logic circuit 9. The time interval measurement circuit 8 produces what we call a trigger offset, which is some fraction of a sample clock period. That amount of time is stored in a location 11 in the input record (6). The trigger location logic may be thought of as the mechanism that controls the horizontal traverse of the eight bits signal 5 from A/D converter 3 as consecutive samples are stored. A trigger will occur while at some address or location in the circular buffer 6. There is no way to know ahead of time where that will be. It is sufficient to take note of that location when the trigger does occur. It is an identifier of that location (corresponding to the trigger event) that is available from the trigger location logic circuit 9 and is stored in location 12 in the input record. Depending upon where the trigger event is supposed to be relative to the displayed trace, (before, after, or somewhere in the middle) the loading of samples into the circular buffer 6 may be halted immediately, or be allowed to continue for a selected number of samples. This too, is the province of the trigger location logic circuit 9.

One other thing happens when the trigger occurs. The output of the trigger circuit 7 causes a time stamp counter 10 to store into location 13 of the input record 6 a count of the number of sample clock cycles. This allows a later ordering of the acquisition records 14 (each of which used to be an input record 6 at one time).

Once the input record is complete it is stored as an acquisition record 14. In our illustrative example of FIG. 1 we assume that there are one hundred acquisition records (14a, 14b, 14c, . . . ), each large enough to store one thousand eight bit samples (16 in 14a) plus their associated trigger location, trigger offset and time stamp (e.g., respectively 18, 17 and 19 in 14a). Line 15 represents an eight bit data path from the circular buffer 6 to the appropriate acquisition record. Sample portion 16 may be thought of as being eight bits deep, as is the corresponding portion of the circular input buffer 6. The portions 11, 12 and 13, as well as 17, 18 and 19, are of course, as big or small as required for the range of values over which their respective contents may range. Which of the various acquisition records 14 is the actual destination of the input record in circular buffer 6 is determined by the trigger offset value associated with the input record. We refer to this feature as "indexing". Each of the acquisition records 14 is assigned the task of representing a certain range of possible values of the trigger offset. In our example there are one hundred acquisition records, so each corresponds to a different one percent range of the possible value, which it will be recalled, is the period of the sample clock (5 ns). While the oscilloscope is operating in a mode where the trace is automatically changed as new data is sampled, the process described above is in effect continuously. Eventually each acquisition record will contain useful data.

The trace on the CRT 25 is created by a raster scan sweep mechanism 24 that accepts data from a bit-mapped frame buffer 23. As far as the waveform trace is concerned, the content of the bit-mapped frame buffer 23 corresponds exactly to the image to be displayed on the CRT 25. The frame buffer may contain other image information, such as soft keys, labels, annunciators, operator determined control settings, cursors and measurement values. The trace data of the frame buffer 23 is taken from another buffer mechanism called a waveform record 22.

Waveform record 22 represents a trace that is, say, eight times denser than what can be seen on the screen of the CRT 25. That is, waveform record 22 has four thousand bytes to correspond to five hundred pixel columns across the waveform trace. Let these columns be named 000–499 and let the byte locations be named 0000–3999. Then the first eight bytes 0000–0007 all correspond to column 000, then next eight byte locations 0008–0013 all correspond to column 001, and so on. Each of the four thousand bytes is an eight bit byte, and so holds a vertical (y direction) value for the pixel column (x value) it is associated with. This means that a given pixel column in the waveform trace can have as many as eight different pixels illuminated, if each of the eight is at a different y value. This mechanism of multiple y's for each x assists in accurately representing noisy signals, as well as producing a more satisfactory display of vertical edges, as are found on clock signals with short rise times. Thus, the data moving from the waveform record 22 to the frame buffer 23 may be thought of as undergoing an eight to one horizontal compression that is produced by a reduction to one eighth horizontal resolution. It may also be thought of as a rounding operation in the x direction while retaining the available resolution in y.

Now notice the region 20a in acquisition record 14a. This is the portion of that acquisition record that corresponds to the end point bytes 0000 and 3999 in waveform record 22. It might be, say, one hundred samples. Each of the other acquisition records has its own such region: 20b in 14b; 20c in 14c; and so on. We show 20a, 20b and 20c in vertical alignment merely as a convenience. Since they began life in the circular buffer 6, they could really be anywhere within the sample portion 16. Their actual individual locations are found relative to their particular trigger locations (18). Anyway, the point to notice is that it is these regions 20a, 20b, 20c, ... that are inspected to produce the content of the waveform record 22.

At this point it will be appreciated that, even if the A/D sampling of the analog input signal is stopped, the displayed trace can (within limits imposed by the amount of memory and the sampling rate, naturally) be reformulated with either a zooming operation or a panning operation, or both. The data is all there in the acquisition records 14; what is needed is to differently identify the regions 20 and then re-load the waveform record 22 and frame buffer 23. To pan, for example, the width of regions 20 would be left as it is, but their location in the acquisition records would traverse earlier ("left") or later ("right") with respect to the trigger location. This is the meaning of the legend PANNING and the horizontal arrows next to the squiggly line 21 that represents the data path from the acquisition records to the frame buffer. Zooming, on the other hand, involves changing the width of the regions 20. To zoom in we narrow a wide region 29 to region 28; this can be done until there are too few samples to work with. To zoom out we expand a narrow region 28 to be a wider one 29. This works until there are no samples corresponding to the period of time being contemplated.

The time stamp counter 10 is reset by a RESET signal 27 that may be derived (not shown) from any convenient event that corresponds to discarding altogether a previous measurement, and starting over with a new one. This might be, for example, the pressing by the operator of an ERASE key. When the trigger circuit 7 produces a trigger signal the time stamp counter outputs its value into location 13 of the circular input buffer 6. From there it eventually ends up in one of the locations 19 in the acquisition memory 14.

Time stamping assists in the reformulation of the waveform record 22 when panning and zooming on data already acquired. First, it helps ensure that the most recent acquisition records are included in the new version of the waveform record 22. This avoids data "going away". Next, it makes it possible to limit how old an acquisition record can be and still be included. This avoids old data "coming back".

Finally, the above described internal operation of the oscilloscope of the block diagram 1 is controlled by a controller 26 in accordance with pre-programmed rules implemented by high-speed processors and state machines, in response to the front panel control settings set either by the operator or by a remote device (e.g., a computer) via a data communications or a network interface. It will be readily appreciated that measurement of waveform parameters, such as voltage, frequency and rise time are essentially inspections of stored data, and are controlled by algorithms stored in and executed by the controller 26. It is to that aspect of the oscilloscope's operation that we now turn.

Figure 2:
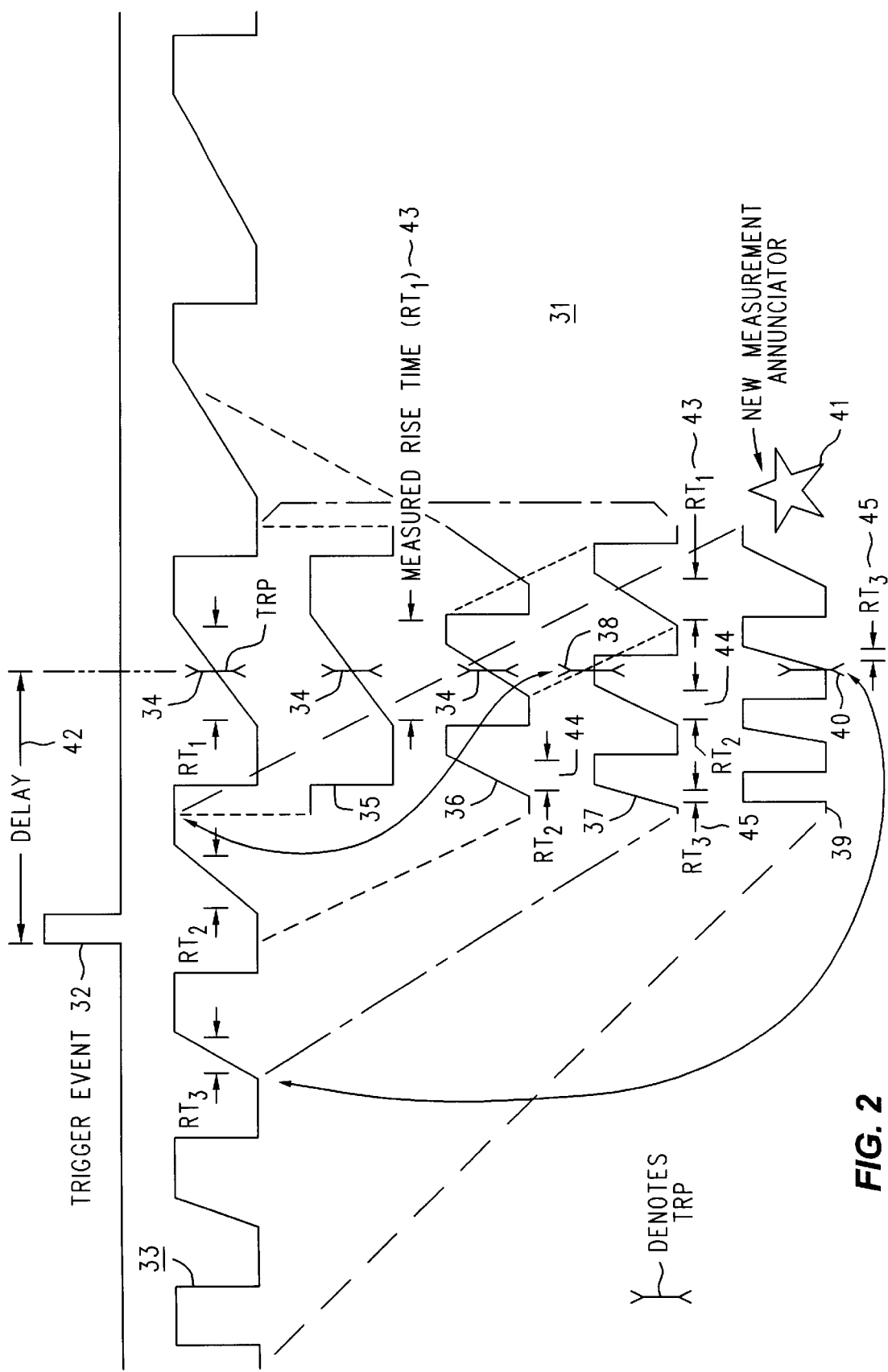
FIG. 2 is a diagram of a captured waveform and several displayed traces generated therefrom, useful in appreciating how instances of automatically measured parameters within the captured waveform are selected according to the invention.

FIG. 2 is a waveform diagram 31 that shows the relationship between some trigger event 32 that is either detected by or supplied to the oscilloscope. We are not concerned with the details of that; for our purposes the leading edge of the trigger event 32 is just "the trigger", however obtained. Waveform 33 is the signal of interest of which waveform portions will be presented as displayed traces. We will assume that all of waveform 33 has been digitized and stored in memory.

By a suitable adjustment of the 'scope's controls displayed trace 35 will be visible on the screen of the CRT 25. Those adjustments would include specifying the amount of delay 42, whatever that amount is. The amount of delay 42 has been chosen such that the TRP 34 corresponds to the middle of the fifth cycle of the captured waveform 33. The adjustments also include setting the TRP to appear in the middle of the displayed trace 35, and then setting the time scale (horizontal time per division) so that majority of what is seen is that fifth cycle. At this point the operator invokes an automated rise time measurement feature. The result is a displayed legend (not shown) indicating the measured value 43 for $RT_1$, whatever that value is. It will, of course, be appreciated that a measurement of rise time is merely an example, and that other types of measurement could be performed, such as period, or an excursion in voltage.

Now suppose that the operator stops the 'scope (or that it was already stopped before $RT_1$, was measured) and zooms out by selecting a longer time scale ("slower sweep speed") while leaving the delay and TRP location unchanged. The result is displayed trace 36. Note that since the TRP is in the center of the trace that the displayed trace is essentially "squeezed in" about the center of the screen, with equal amounts of new trace coming from both the left and the right. Since in this example the TRP 34 was selected to lie within the extent of $RT_1$, in trace 35, it remains so in trace 36. Note, however, that $RT_2$ is now visible on the screen as part of the displayed trace. With a conventional digital 'scope it would be the value for $RT_2$ that appears in the annunciator for the measured rise time (since it is the first rise time visible); according to the invention that value remains the one for $RT_1$, since $RT_1$, is closest to the TRP.

Another aspect to take note of for displayed trace 36 is this. There might never have been displayed trace 35; suppose the initial control settings were such that trace 36 is what is initially displayed subsequent to capture of waveform 33 and trigger event 32. The same observation about $RT_1$, and $RT_2$ obtains. According to the invention $RT_1$, which is closest to the TRP, would be the rise time value indicated, rather than $RT_2$, which is the first visible rise time.

Now let's say that the operator keeps the time scale and TRP location the same (center of trace), but reduces the amount of delay so that the displayed trace begins with the onset of the third cycle of waveform 33. The result is displayed trace 37. Note that the TRP 38 does not correspond to previous TRP 34. It can't, since the region displayed has been panned to the left. Also note that we have a choice to make. If we are to always automatically select as the parameter to be measured the one that is closest to the TRP, then we would select $RT_2$ and indicate its value, and perhaps illuminating or displaying a NEW MEASUREMENT indicator or annunciator, as discussed below in connection with trace 39. On the other hand, we could note that $RT_1$, is still visible as part of the displayed trace, and decline to measure a different rise time unless manually instructed to do so. Why might this be of value? In the example as shown it is fairly easy to visually distinguish one cycle from another; they each have a noticeably different rise time. But if all the cycles were fairly similar, and the 'scope changed the selection without warning, it could be confusing. Because they look so much alike, it would be very easy to lose track of which cycle was which. On the other hand, the philosophy might be that only so much can (or should) be done to help the inept operator. Since the selected delay value is displayed (although it is not shown in the figure) and the TRP goes as the delay goes, the different cycles closest to the TRP can always be distinguished according to their associated (and displayed) delay value, even if they are otherwise identical in shape. Which manner of operation (measure $RT_2$ 44 or keep measuring $RT_1$, 43) could be chosen in advance by the designer, or it could be a selection made in accordance with the preferences of the operator.

In any event, it will be agreed that if the visible trace is panned so far to the left as to become trace 39, which shows nearly the first four cycles, and excludes $RT_1$, altogether, then the automatic selection mechanism should select $RT_3$ 45 for measurement, since it is closest to the TRP and there is no prior selection still visible. It is under such or similar circumstances that it may be desirable to display or otherwise indicate a "NEW MEASUREMENT" annunciator or other indication, whose meaning is that the instance of the automatically selected parameter being measured is possibly no longer the previous instance. We say possibly, even though in this example it seems a sure thing, because the example assumes the data has stayed the same and only the control settings have changed. If the 'scope is stopped, then it is surely the case that the data has not changed and it must be that a new instance is being measured. But if the 'scope is running, then not only might the control settings of the 'scope change, but the data itself might change. If the data should change then only the operator can make a sensible judgement. Thus, the purpose of such an annunciator is simply to warn or alert the operator that confidence that the same instance as before is being measured is low, lest he be fooled through inattention. In the figure we have fancifully represented such an annunciator or indication as star 41. Its actual form could vary in accordance with designer choice, and could include such things as displayed iconic symbols or readable legends spelled out with an alphabet. It could blink or be steadily visible, be present only for a short time (say, a few seconds) or remain present until acknowledged through some operator action.

Refer now to FIG. 3, which is a simplified flow chart segment 46 illustrating how to automatically select a measurement that is closest to the TRP. The segment 46 has an entrance path 47 and an exit path 51, between which are three steps 48, 49 and 50. Path 47 represents departure from some step in a larger overall control process (not shown) executed by or within controller 26 of FIG. 1. The significance of being on path 47 is, as indicated by the legend in the figure, that there is data in the acquisition memory and that an automatically selected measurement is to be performed. Steps 48–50 will make the automatic selection and exit on path 51, which leads to steps that make and display that measurement. Presumably, steps 48–50 replace prior art steps that merely found the earliest measurable waveform feature.

Step 48 starts at the TRP and searches on each side thereof to find edges (transitions) in the waveform (preferable at the level of the waveform record 22, rebuilding it if need be) that are relevant to the waveform feature of interest. In accordance with conventional technique, different types of parameters to be measured might use a different rule for defining an edge. One could scan the entire acquisition memory, but it is on average faster to simple begin with the TRP and go left for one edge and then right for the next two.

At step 49 the found edges are examined in relation to their distance (in time) to the TRP, and the closest one is selected. This picks which instance of the waveform feature will be measured.

At step 50 the displacement (a signed value indicating how much and which way) in time called "Δ" is noticed; its value may be saved as being of use to other overhead operations not of particular interest here. Step 50 then transitions to path 51, whereupon the measurement is performed and the result displayed, each in a manner already known to the art.

Figure 4:
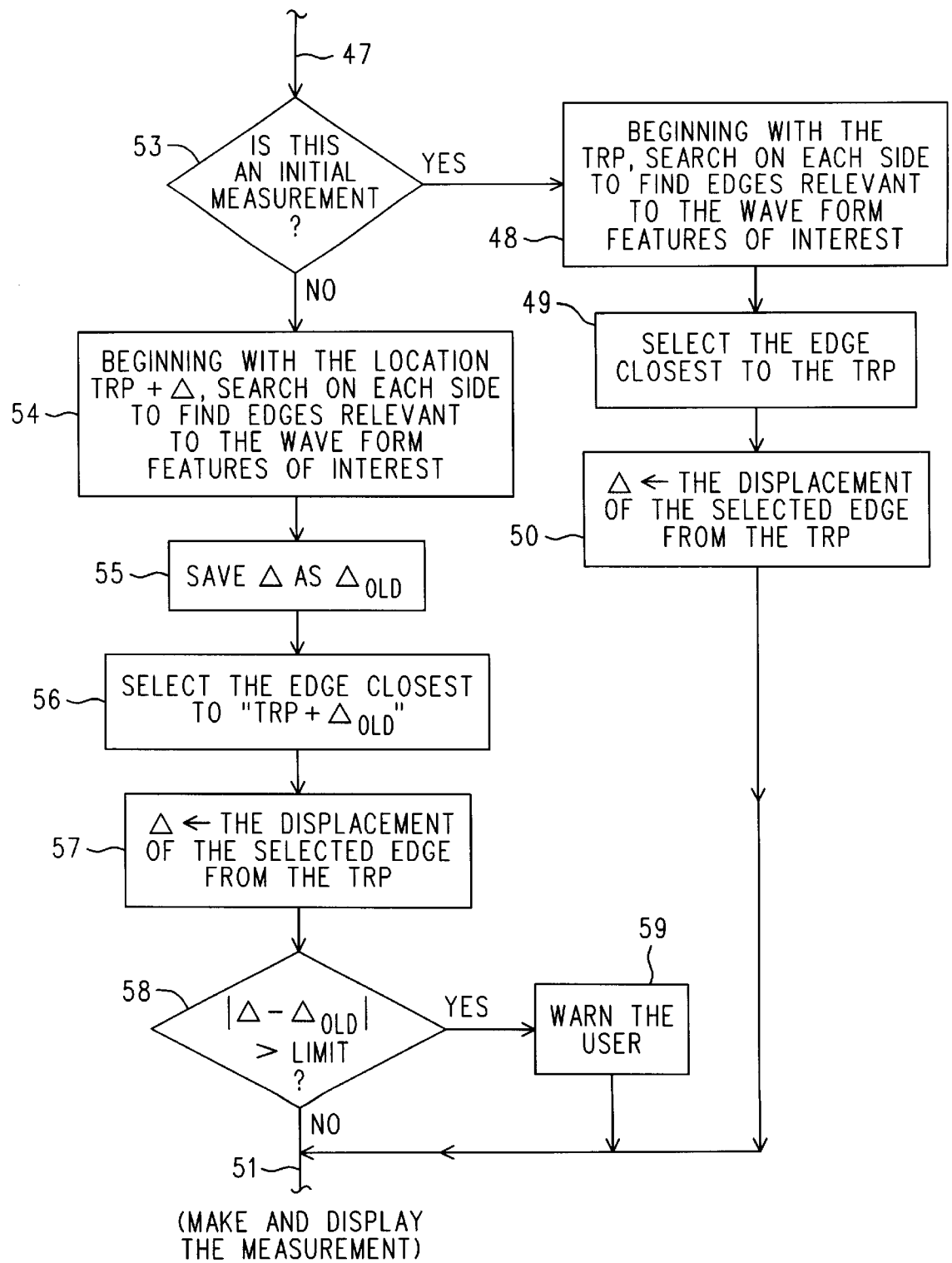
FIG. 4 is a simplified flow chart illustrating a second aspect of the process of automatically selecting a waveform feature to be measured by a digital oscilloscope constructed in accordance with the invention.

Now consider the simplified flow chart segment 52 of FIG. 4, wherein reference numerals denoting steps and environmental conditions that are the same or substantially similar to those of FIG. 3 have the same number. As before, the entrance path is 47 and the exit path is 51, and presumably, steps 48–50 and 53–59 replace prior art steps that merely found the earliest measurable waveform feature. FIG. 4 describes a modification to FIG. 3 that allows a previously automatically selected instance of a waveform feature to be tracked and still measured, even though it might no longer be closest to the TRP. This manner of operation is useful if it is desired to view a previously automatically selected measurement in a different context.

In the flow chart segment 52 of FIG. 4 path 47 leads to a qualifier step 53, where it is determined if the measurement to be made is an initial measurement. That is, is it the first measurement subsequent to the request from the operator to begin performing this particular type of measurement? For example, cancelling a measurement mode and then later re-instituting it would produce another initial measurement.

If the measurement is an initial measurement, then the YES path from qualifier step 53 leads to a sequence of steps 48–50 that are the same as those of FIG. 3, followed by an exit on path 51. That is, the initially measured instance will be the one that is closest to the TRP, just as in FIG. 3. The only difference is that we indeed plan to make use of Δ.

Now suppose that a subsequent measurement is to be made. Now we exit from qualifier step 53 along the NO path and reach step 54. Step 54 is essentially the same as step 48, except that the location TRP+Δ is used instead of simply the TRP. A moment's reflection will convince the reader that, in the case where the 'scope is stopped, the first instance of step 54 will likely produce the same collection of edges as did step 48. Why? Because the data is not changing and nothing has been done to allow A to change, even if the operator is altering the display controls.

Next, step 55 saves Δ as $\Delta_{old}$, in preparation for step 56.

At step 56 the edge closest to TRP+$\Delta_{old}$ is found and selected to be the instance to be measured.

At step 57 a new value for Δ is found that is the displacement of this selected edge from the TRP. This value of Δ can indeed be different than before, since differences in the controls for the display settings will effect it, as can changes in the data if the 'scope is running. It will be noted and appreciated that steps 54–57 constitute a tracking mechanism.

Steps 58 and 59 determine if a warning annunciator (which is itself optional) should be activated to warn the user that there is low confidence that the instance selected at step 56 is the same as the previous instance. A preferable way to detect this is for qualifier step 58 to determine if the difference between Δ and $\Delta_{old}$ exceeds some limit. For example, the limit might be one tenth the time represented by the width of the displayed trace if the 'scope is running. If the 'scope is stopped one might take as the limit one half of the shortest time between adjacent edges found in step 54.

What is claimed is:

1. A method of automatically selecting within the trace of a digital oscilloscope a waveform feature upon which to perform a measurement, the method comprising the steps of:

storing digitized values representative of the waveform for a signal;

triggering the digital oscilloscope in response to the detection of a trigger event;

displaying upon a video display a trace having a selected time scale and a trigger reference point indicated therein that represents a selected distance in time away from the occurrence of the trigger event and that is also located at a selected location in the trace;

selecting a type of waveform feature that is to be measured automatically;

inspecting the stored digitized values to determine which, if any, of the waveform features that are of the selected type is closest in time to the trigger reference point; and performing the selected type of measurement upon the waveform feature determined by the inspecting step.

2. A method of automatically re-selecting within the trace of a digital oscilloscope a previously automatically selected waveform feature upon which to perform a measurement, the method comprising the steps of:

storing digitized values representative of the waveform for a signal;

triggering the digital oscilloscope in response to the detection of a trigger event;

displaying upon a video display a trace having a selected time scale and a trigger reference point indicated therein that represents a selected distance in time away from the occurrence of the trigger event and that is also located at a selected location in the trace;

selecting a type of waveform feature that is to be measured automatically;

initially inspecting the stored digitized values to determine which, if any, of the waveform features that are of the selected type is closest in time to the trigger reference point;

performing the selected type of measurement upon the waveform feature determined by the step of initially inspecting; thereafter subsequently inspecting the stored digitized values to determine which, if any, of the waveform features that are of the selected type is closest in time to the waveform feature most recently measured; and subsequently performing the selected type of measurement upon the waveform feature determined by the step of subsequently inspecting.

3. A method as in claim 2 further comprising the step of indicating that a difference in a time axis value between consecutively performed selected types of measurement exceeds a selected limit.

* * * * *